(12) United States Patent
Ferrara

(10) Patent No.: US 6,774,373 B2
(45) Date of Patent: Aug. 10, 2004

(54) ADJUSTABLE IMPLANTATION ANGLE WORKPIECE SUPPORT STRUCTURE FOR AN ION BEAM IMPLANTER

(75) Inventor: Joseph Ferrara, Middleton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/628,170

(22) Filed: Jul. 28, 2003

(65) Prior Publication Data

US 2004/0021092 A1 Feb. 5, 2004

Related U.S. Application Data

(60) Provisional application No. 60/399,650, filed on Jul. 29, 2002.

(51) Int. Cl.[7] .......................... H01J 37/317; H01J 37/00
(52) U.S. Cl. .............................. 250/491.1; 250/492.21; 250/440.11; 250/442.11; 250/281; 250/398
(58) Field of Search .................... 250/491.1, 492.21, 250/440.11, 442.11, 281, 398

(56) References Cited

U.S. PATENT DOCUMENTS

| | | |
|---|---|---|
| 4,761,559 A | 8/1988 | Myron |
| 4,975,586 A | 12/1990 | Ray |
| 5,229,615 A | 7/1993 | Brune et al. |
| 5,436,790 A | 7/1995 | Blake et al. |
| 5,444,597 A | 8/1995 | Blake et al. |
| 6,163,033 A | 12/2000 | Smick et al. |
| 6,207,959 B1 | 3/2001 | Satoh et al. |
| 6,710,360 B2 * | 3/2004 | Ferrara .................. 250/492.21 |

* cited by examiner

Primary Examiner—Nikita Wells
(74) Attorney, Agent, or Firm—Watts Hoffmann Co., LPA

(57) ABSTRACT

An ion beam implanter includes an ion beam source for generating an ion beam moving along a beam line and an implantation chamber wherein a workpiece is positioned to intersect the ion beam for ion implantation of a surface of the workpiece by the ion beam. The ion beam implanter further includes a workpiece support structure coupled to the implantation chamber and supporting the workpiece. The workpiece support structure includes a first rotation member rotatably coupled to the implantation chamber and including an opening extending through the rotation member and aligned with an opening in a wall of the implantation chamber. The workpiece support structure further includes a second rotation member rotatably coupled to the first rotation member and having an axis of rotation offset from an axis of rotation of the first rotation member, the second rotation member overlying the opening of the first rotation member. The workpiece support structure also includes a third member fixedly attached to the second rotation member, the third member including a rotatable drive supporting the workpiece. The first rotation member, the second rotation member and the rotatable drive of the third rotation member rotate to move the workpiece along a path of travel for implantation of the implantation surface wherein a distance that the ion beam moves through the implantation chamber before striking the implantation surface of the workpiece is constant.

28 Claims, 5 Drawing Sheets

ADJUSTABLE IMPLANTATION ANGLE WORKPIECE SUPPORT STRUCTURE FOR AN ION BEAM IMPLANTER

CROSS-REFERENCE TO RELATED APPLICATION

This application claims priority from U.S. provisional application serial No. 60/399,650, filed on Jul. 29, 2002.

FIELD OF THE INVENTION

The present invention relates to an adjustable implantation angle workpiece support assembly or structure coupled to an implantation chamber of an ion beam implanter and, more particularly, to a workpiece support assembly or structure that provides for rotational and linear movement of a workpiece with respect to an ion beam such that an implantation angle of the workpiece may be selected and the workpiece translated along a linear path at the selected implantation angle wherein a distance from an ion beam entrance to the implantation chamber to the intersection of the ion beam and an implantation surface of the workpiece remains constant during translation of the workpiece.

BACKGROUND ART

Ion beam implanters are widely used in the process of doping semiconductor wafers. An ion beam implanter generates an ion beam comprised of desired species of positively charged ions. The ion beam impinges upon an exposed surface of a workpiece such as a semiconductor wafer, a substrate or a flat panel, thereby "doping" or implanting the workpiece surface with desired ions. Some ion implanters utilize serial implantation wherein a single, relatively large wafer workpiece is positioned on a support in an implantation chamber and implanted serially, that is, one workpiece is implanted at a time. The support is oriented such that the workpiece is in the ion beam beam line and the ion beam is repetitively scanned over the workpiece to implant a desired dosage of ions. When the implantation is complete, the workpiece is removed from the support and another workpiece is positioned on the support for implantation.

In recent years, the trend in the semiconductor industry has been to use increasingly larger wafer workpieces, for example, 300 mm. diameter wafers. The ability to implant large wafer workpieces or other workpieces such as flat panels has become very desirable. One way to implant a workpiece serially is to move it in front of a scanned, fanned or ribbon ion beam. Such an ion beam is wide enough so that the entire width of the workpiece can be implanted uniformly. In order to implant the entire workpiece, a second motion transverse to a direction or extent of the ion beam is required. Further, it is often desired to be able to change an angle of implantation for a particular workpiece being implanted. The angle of implantation is the angle of incidence formed between the ion beam and the treatment surface of the workpiece. An implantation angle of 0 degrees means that an implantation surface of the workpiece is normal to the ion beam beam line.

One shortcoming of workpiece support structures of prior art ion beam implanters is that, other than an implantation angle of 0 degrees, movement of the workpiece along a path of travel perpendicular to the ion beam beam line causes a distance that the beam travels within the implantation chamber before striking the workpiece implantation surface to change. Stated another way, if the implantation angle is not 0 degrees, the workpiece can be viewed as being tilted with respect to the ion beam beam line. If such a tilted workpiece is moved perpendicularly with respect to the ion beam beam line, when portions of the workpiece tilted toward the ion beam are being implanted, a distance that the ion beam travels in the implantation chamber before striking the implantation surface will be reduced compared to the beam distance at a center of the workpiece implantation surface. On the other hand, when portions of the workpiece tilted away from the ion beam are being implanted, a distance that the ion beam travels in the implantation chamber before striking the implantation surface will be greater compared to a beam distance at a center of the workpiece implantation surface.

Obviously, the larger the workpiece and the greater the implantation angle is from 0 degrees, the greater the difference in the beam distance traversed by the ion beam within the implantation chamber as implantation moves from one end of the workpiece implantation surface to an opposite end of the implantation surface. As the ion beam tends to diffuse over its beam path, non-constant beam distance may have an adverse effect on achieving a uniform ion dosage implantation over an entirety of the workpiece implantation surface. Thus, the trend toward larger wafers exacerbates this non-constant beam distance problem.

To insure uniform implantation of a workpiece implantation surface, it would be desirable to maintain a substantially constant beam distance traversed by ion beam within the implantation chamber before striking the implantation surface of the workpiece. What is desired is a workpiece support structure that provides the capability of selecting a desired implantation angle and then maintaining a substantially constant beam distance between entry of the ion beam into the implantation chamber and impacting the implantation surface while the workpiece is moved with respect to the ion beam beam line during the implantation procedure.

SUMMARY OF THE INVENTION

One exemplary embodiment of the present invention concerns an ion beam implanter having a workpiece support structure or assembly for supporting a workpiece within a vacuum or implantation chamber. The ion beam implanter includes an ion beam source for creating an ion beam and a beam line for transporting the ion beam along a path of travel and being scanned along an axis. A workpiece is supported by the workpiece support structure in the implantation chamber such that the workpiece is positioned to intersect the path of travel of the scanned ion beam for implantation of a implantation surface of the workpiece by the ion beam. Advantageously, the workpiece support structure provides for: a) selecting a desired implantation angle; and b) moving the workpiece for implantation of the implantation surface by the ion beam while maintaining a substantially constant beam distance between entry of the ion beam into the implantation chamber and striking the implantation surface.

The workpiece support structure is coupled to the implantation chamber and supports the workpiece. The workpiece support structure includes a first rotation member rotatably coupled to the implantation chamber, the rotation member having an axis of rotation perpendicular to a path of the ion beam and defining an opening through a width of the rotation member and offset from the rotation member's axis of rotation. The workpiece support structure further includes a second rotation member rotatably coupled to the first rotation member and having an axis of rotation offset from the axis of rotation of the first rotation member. The second rotation member overlies and seals the opening in the first rotation member.

The workpiece support structure additionally includes a third member fixedly attached to the second rotation member. The third member including a rotatable drive having an axis of rotation aligned with the axis of rotation of the first rotation member and also aligned with an implantation surface of the workpiece to be implanted. A workpiece holder is attached to the rotatable drive of the third member and extends through the first and second rotation members into the implantation chamber and supports the workpiece within the implantation chamber. Rotation of the first rotation member and the third member rotatable drive changes an implantation angle of the workpiece with respect to the path of the ion beam in the implantation chamber. Proper rotation of the first rotation member, the second rotation member and the third member rotatable drive results in a linear movement of the workpiece along a path of travel in a direction transverse to the ion beam while maintaining the a selected implantation angle.

Advantageously, a distance between entry of the ion beam into the implantation chamber and an intersection of the ion beam and a surface of the workpiece remains substantially constant during movement of the workpiece along its linear path of travel.

These and other objects, advantages, and features of the exemplary embodiment of the invention are described in detail in conjunction with the accompanying drawings.

DETAILED DESCRIPTION

Figure 1:
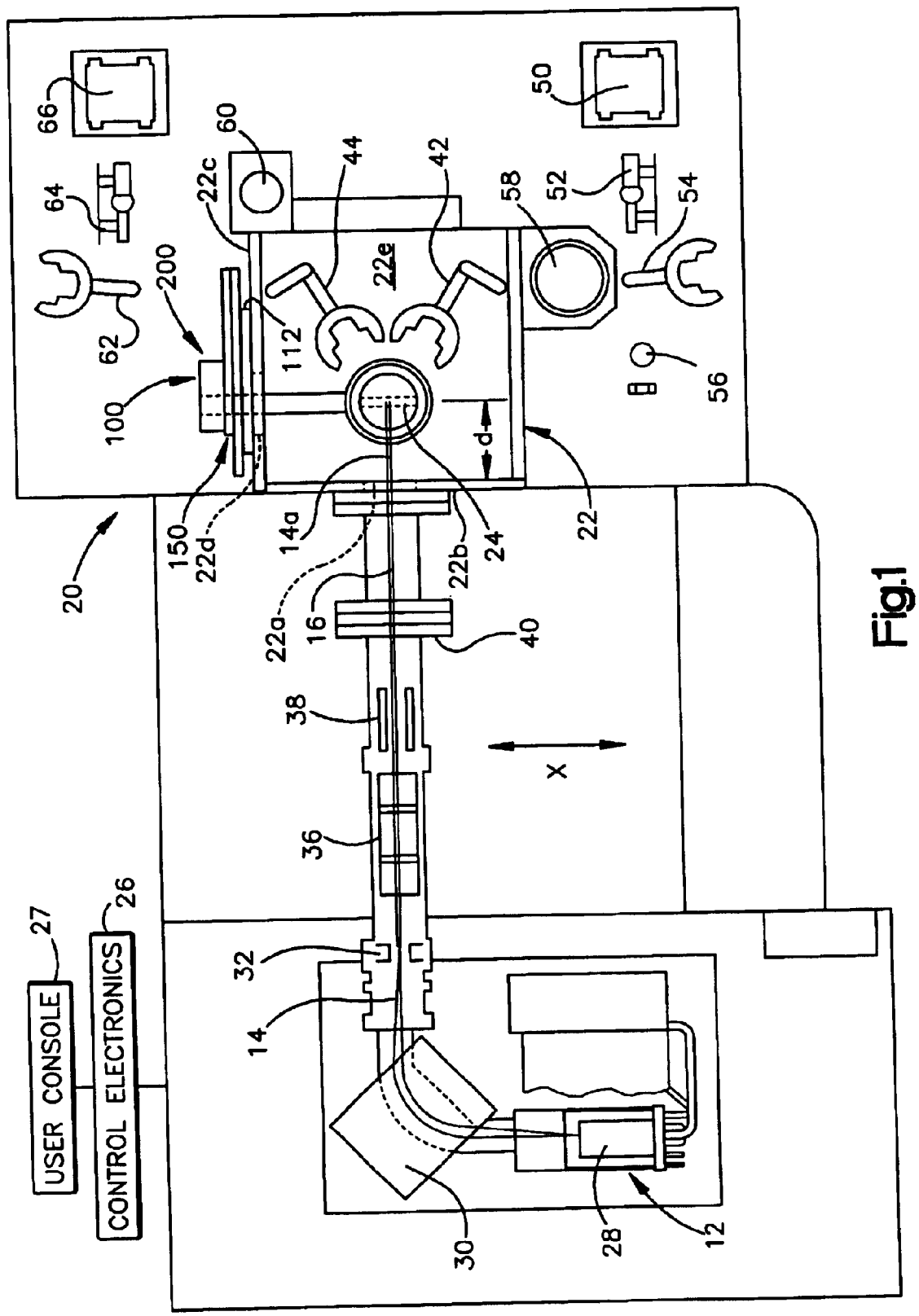
FIG. 1 is a schematic plan view of an ion beam implanter of the present invention.
Figure 2:
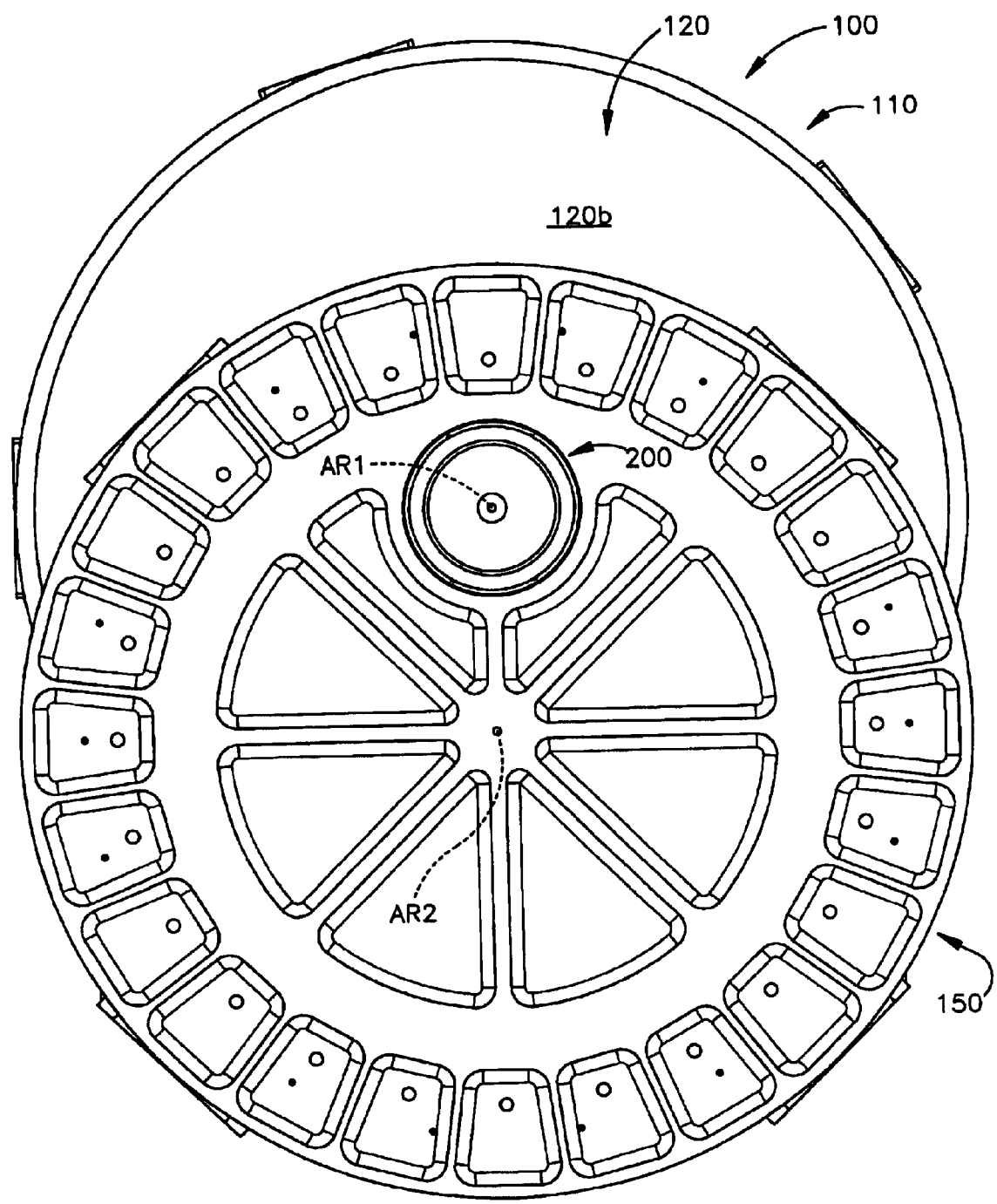
FIG. 2 is a schematic side elevation view of a workpiece support structure of the ion beam implanter of FIG. 1, the workpiece support structure being affixed to an implantation chamber of the ion beam implanter.
Figure 3:
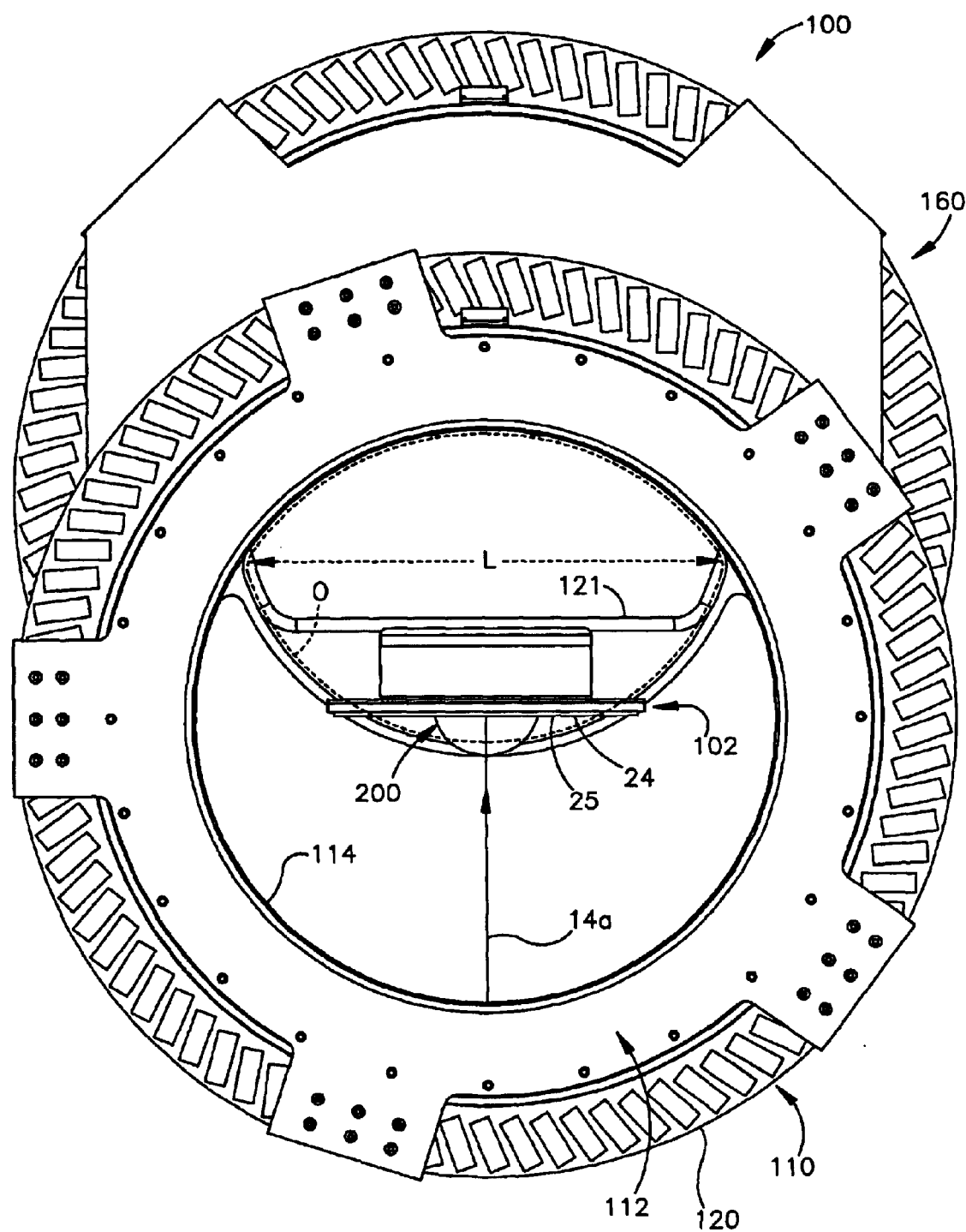
FIG. 3 is a schematic side elevation view the workpiece support structure of FIG. 2 as viewed from inside the implantation chamber of the ion beam implanter.

Turning to the drawings, an ion beam implanter is shown generally at 10 in FIG. 1. The implanter includes an ion source 12 for creating ions that form an ion beam 14 which traverses a beam path 16 to an end or implantation station 20. The implantation station includes a vacuum or implantation chamber 22 defining an interior region 22e in which a workpiece 24 such as a semiconductor wafer, substrate or flat panel workpiece is positioned for implantation by the ion beam 16. Control electronics (shown schematically at 26) are provided for monitoring and controlling the ion dosage received by the workpiece 24. Operator input to the control electronics 26 are performed via a user console 27.

The ion source 12 generates the ion beam 14 which impacts the workpiece 24. The ions in the ion beam 14 tend to diverge as the beam traverses a distance along the beam path 16 between the ion source 12 and the implantation chamber 22. The ion source 12 includes a plasma chamber 28 defining an interior region into which source materials are injected. The source materials may include an ionizable gas or vaporized source material.

Positioned along the beam path 16 is an analyzing magnet 30 which bends the ion beam 14 and directs it through a beam shutter 32. Subsequent to the beam shutter 32, the beam 14 passes through a quadruple lens system 36 that focuses the beam 14. The beam path 16 extends through deflection electrodes 38 wherein the ion beam 14 is repetitively deflected or scanned to generate a ribbon ion beam such that a portion of the ion beam 14 within the implantation chamber 22 is a ribbon ion beam 14a. The ribbon ion beam 14a enters the implantation chamber 22 through an opening 22a in a front wall 22b of the chamber 22. A ribbon ion beam 14a is an ion beam that essentially has the shape of a very narrow rectangle that is, a beam that extends in one direction, e.g., has a horizontal or x direction or extent (shown as W in FIG. 5) with very limited extent in the orthogonal direction, e.g., in the vertical or y direction.

Generally, the extent of the ribbon ion beam 14a is sufficient to implant the entire corresponding dimension of the workpiece 24, that is, if the ribbon ion beam 14a traversing the implantation chamber 22 extends in the horizontal or X direction (FIGS. 1 and 5) and the workpiece 24 has a horizontal dimension of 300 mm. (or a diameter of 300 mm.), the control electronics 26 will appropriately energize the electrodes 38 such that a horizontal extent, W, of the ribbon ion beam 14a, upon striking the workpiece 24 within the implantation chamber 22, will be greater than 300 mm. for a 300 mm. workpiece.

As will be explained below, a workpiece support structure 100 both supports and move the workpiece 24 with respect to the ribbon ion beam 14 during implantation such that an entire implantation surface 25 of the workpiece 24 is implanted with ions. In addition to the scanning technique described above, those of skill in the art will recognize that the ribbon shape of the ribbon ion beam 14a within the implantation chamber 22 can be created in a number of ways. For example, an arc slit of the plasma chamber 28 may be shaped such that the ion beam as created has a ribbon shape from inception. The present invention is not limited to the use of any particular technique or structure to shape or form the ion beam.

A more detailed description of an ion implanter adapted for serial implantation of workpieces is disclosed in U.S. Pat. No. 4,975,586, issued to Ray et al. on Dec. 4, 1990 and U.S. Pat. No. 4,761,559, issued to Myron on Aug. 2, 1988. The '586 and '599 patents are assigned to the assignee of the present invention and are incorporated herein in their respective entireties by reference.

The implantation chamber interior region 22e is evacuated. Two robotic arms 42, 44 mounted within the implantation chamber 22 automatically load and unload wafer workpieces to and from a workpiece support assembly or structure 100. The workpiece 24 is shown in a horizontal loading position in FIG. 1. Prior to implantation, the workpiece support structure 100 rotates the workpiece 24 to a vertical or near vertical position for implantation. If the workpiece 24 is vertical, that is, normal with respect to the ion beam 14, the implantation angle or angle of incidence is 0 degrees. It has been found that to minimize undesirable channeling effects, typically, a small but nonzero implantation angle is selected.

In a typical implantation operation, undoped workpieces are retrieved from a first cassette 50 by a shuttle 52 which brings a workpiece 24 to the vicinity of a robotic arm 54 which moves the workpiece to an orienter 56, where the workpiece 24 is rotated to a particular crystal orientation. The arm 54 retrieves the oriented workpiece 24 and moves it into a loading station 58 adjacent the implantation chamber 22. The loading station 58 closes, is pumped down to a desired vacuum, and then opens into the implantation chamber 22. The first arm 42 within the implantation station 22 grasps the workpiece 24, brings it within the implantation chamber 22 and places it on an electrostatic clamp or chuck 102 of the workpiece support structure 100. The electrostatic clamp 102 is energized to hold the workpiece 24 in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion implantation of the workpiece 24, the workpiece support structure 100 returns the workpiece 24 to a horizontal position and the electrostatic clamp 102 is deenergized to release the workpiece. The second arm 42 of the implantation station 22 grasps the implanted workpiece 24 and moves it from the implantation chamber 22 to an unload station 60. From the unload station 60, a robotic arm 62 moves the implanted workpiece 24 to a shuttle 64 which places the workpiece into a second cassette 66.

The workpiece support structure 100 is operated by the control electronics 24, supports the workpiece 24 during implantation, and, advantageously, permits both rotational and translational movement of the workpiece 24 with respect to the ribbon ion beam 14a within the implantation chamber 22. By virtue of its rotational capability, the workpiece support structure 100 advantageously permits selection of a desired implantation angle (IA) or angle of incidence between the ion beam 14 and an implantation surface 25 of the workpiece 24. By virtue of its translational or linear movement capability, the workpiece support structure 100 permits the implantation surface of the workpiece 24 to be moved along a plane coincident with the desired implantation angle (IA) during implantation thereby both maintaining the desired implantation angle and additionally keeping substantially constant a distance d (FIG. 1) that the ribbon ion beam 14a travels from its entry into the implantation chamber interior region 22e to the point (actually a line because the ion beam is a ribbon ion beam) where it impacts the implantation surface 25 of the workpiece 24. This substantially constant distance is maintained during the during entire implantation of the implantation surface 25. That is, the substantially constant distance is maintained as the workpiece 25 moves transversely with respect to the ribbon ion beam 14a, in a plane coincident with the desired implantation angle (IA) such that the entire implantation surface is implanted in the vertical or Y direction.

The maintenance of a substantially constant distance or path of travel for the ion beam 14a between the implantation chamber 22 and the impact of the ion beam 14a on the workpiece 24 is highly desirable for uniform ion implantation characteristics over the entire implantation surface 25 of the workpiece 24. Another way of looking at the workpiece support structure 100 is that it permits a substantially constant path of travel of the ion beam 14 from the ion source 12 to the point were it impacts the workpiece implantation surface 25.

During a production run, semiconductor wafer workpieces or flat panel workpieces are serially implanted. That is, when one workpiece's implantation is completed, the electrostatic clamp 102 is deenergized to release the implanted workpiece. The implanted workpiece is then automatically removed from the implantation chamber 22 and another workpiece is positioned on a support surface 104 the electrostatic clamp 102. The electrostatic clamp 102 is suitably energized to securely hold the workpiece 24 on the support surface 104.

Figure 4:
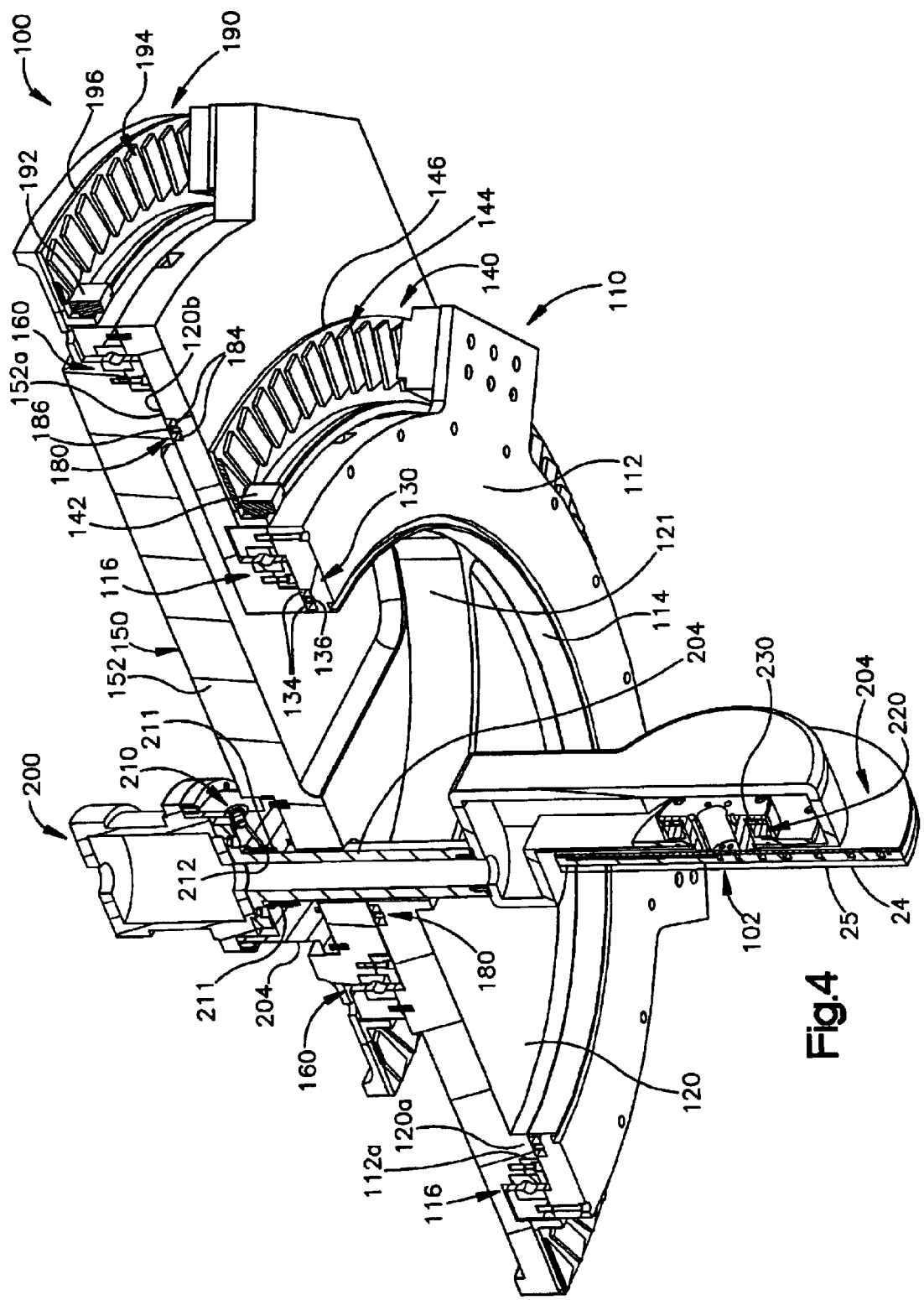
FIG. 4 is a sectional perspective view of the workpiece support structure as viewed from a bottom side of the workpiece support structure, that is, viewed from inside the implantation chamber of the ion beam implanter.
Figure 5:
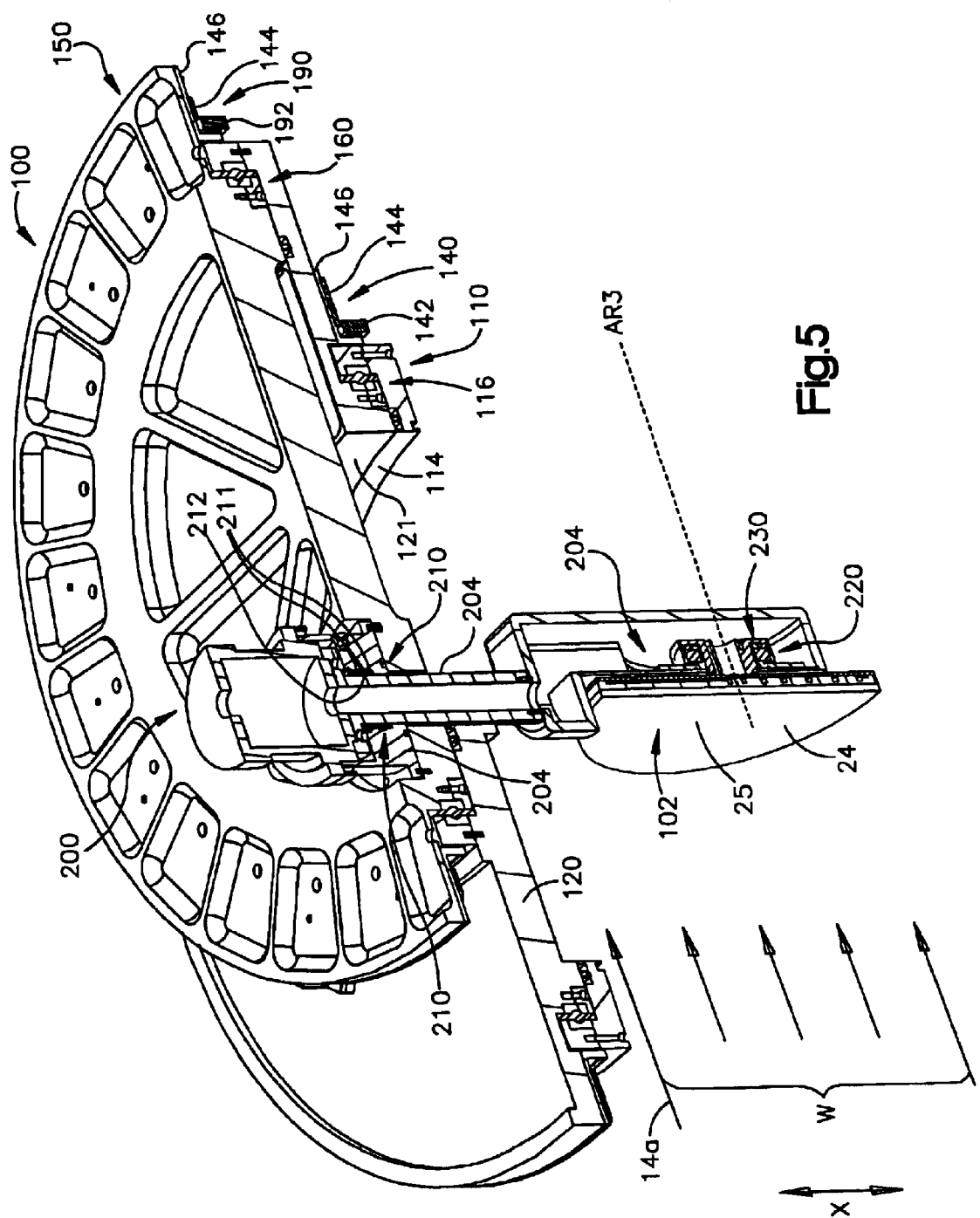
FIG. 5 is a sectional perspective view of the workpiece support structure as viewed from a top side of the workpiece support structure.

The workpiece support structure 100 is best shown in FIGS. 2–5. After a workpiece 24 is loaded on the support surface 104 of the electrostatic clamp 102 when the electrostatic clamp is in the workpiece loading and unloading position (FIG. 1), the workpiece support structure 100 rotates the workpiece 24 to an implantation position. FIGS. 4 and 5 show the electrostatic clamp 102 supporting the workpiece 24 in an implantation position. FIG. 1 shows the position of the workpiece 24 in the implantation position in dashed line, the distance d is the distance the ion beam 14a traverses from entering the implantation chamber 22 to impacting the workpiece 24.

During implantation of the workpiece 24, the workpiece support structure 100 moves the workpiece 24 in a direction transverse to the ribbon ion beam 14a such that the entire implantation surface 25 is appropriately impacted and implanted with desired ions. As can be seen in the schematic depiction in FIG. 5, the ribbon ion beam 14a at a point of impact with the workpiece 24 has a width W along an X direction (as defined by the X axis shown in FIGS. 1 and 5) which is greater than the diameter of the workpiece 24, thus, no translation of the workpiece in the X direction is required for full implantation of the workpiece.

As can best be seen in FIG. 1, the workpiece support structure 100 is affixed to a side wall 22c of the implantation chamber 22 and extending into the interior region 22e of the implantation chamber 22 through an opening 22d in the implantation chamber side wall 22c. The workpiece support structure 100 includes a first rotation member 110, a second rotation member 150 rotatably mounted to the first rotation member 110 and a drive mechanism 200 mounted to the second rotation member 150. The first rotation member 110 and the second rotation member 150 are each driven by their own circular track linear motors 140, 190 (FIG. 4). Each circular track linear motor 140, 190 comprises electromagnetic coils 142, 192 arranged in a circular pattern. The circular track linear motors 140, 190 further include a corresponding set of permanent magnets 144, 194 supported on respective magnet track plates 146, 196. The electromagnetic coils 142, 192 are appropriately energized by the control electronics 26 to precisely control rotation of the first and second rotation members 110, 150 with respect to the implantation chamber 22.

The workpiece support structure first rotation member 110 includes a stationary, flat support plate 112 which is affixed to the implantation chamber 22 and, preferably, to the implantation chamber side wall 22c. The support plate 112 includes an opening 114 aligned with the opening 22d of the implantation chamber side wall 22c (FIG. 1).

The first rotation member 110 also includes a hub 120 which is rotatably coupled to the implantation chamber 22 and, more specifically, is rotatably coupled to the support plate 112 of the rotation member 110. The hub 120 is attached to the support plate 112 by means of a bearing assembly 116. The hub 120 includes an roughly football-shaped throughbore or opening 121 extending through a width of the hub. The opening 121 is defined by two intersecting arcuate members having different radii of curvature. The approximate bounds of the opening 121 is shown by the dashed line labeled O in FIG. 3. A longitudinal extent of the opening O is labeled as L in FIG. 3. In one exemplary embodiment of the present invention the opening O has a longitudinal extent of 60 cm. The opening 121 is aligned with the opening 22d of the implantation chamber side wall 22c.

The first rotation member hub 120 is attached to the support plate 112 by means of a bearing assembly 116. Preferably, the bearing assembly 116 is a ball or roller bearing assembly including a plurality of ball or roller bearings 118 disposed in a circular bearing cage 119 to provide for rotation of the support plate 112 with respect to the implantation chamber 22. Alternately, other mechanical ball or roller bearing assemblies known to those of skill in the art may be utilized or, instead of a mechanical bearing assembly, a non-contact air-bearing could be suitably employed as would be recognized by one of ordinary skill in the art.

Vacuum is maintained between the interior region 22e (FIG. 1) of the implantation chamber 22 and outside atmosphere by means of differentially pumped circular or radial vacuum seal system 130. The vacuum seal system 130 is a contact type vacuum seal. As can best be seen in FIG. 4, the vacuum seal system 130 includes two circular recesses or grooves 134 separated by a circular channel 136 machined or formed in the upper surface 112a of the support plate 112. Disposed in each of the three grooves 134 is an O-ring and a plastic seal having a substantially square cross section. An upper surface of each of the two seals 138 bears against a lower surface 120a of the hub 120.

The channel 136 is in fluid communication with a vacuum pump (not shown) via orifices (not shown) in the support plate 112. The vacuum pump, which would be affixed to the support plate, would be operated to draw a vacuum in the channel 136 thereby removing any air and/or contaminants that happen to leak from the outside atmospheric environment through the seal formed by the outer O-ring and plastic seal combination. In addition to a differentially pumped circular vacuum seal system, other seal system designs such as a lip seal or other polymer material seal designs would also be suitable and are within the contemplated scope of the present invention.

Additionally, non-contact vacuum seal systems would also be suitable as a vacuum seal system. In a non-contact vacuum seal system, O-rings and plastic seals are not utilized. Instead one or more circular channels (such as channels 136) would be machined in the lower surface 112a of the support plate 112. The channels would be in fluid communication with vacuum pump coupled to the support plate 112. The vacuum pump would be operated to draw a vacuum in the circular channels.

The first rotation member 110 allows for a +/−90 degree rotation with respect to the ribbon ion beam 14a. The centerline or axis of rotation (shown in dashed line as AR1 in FIG. 2) of the first rotation member 110 is aligned with the front or implantation surface 25 of the workpiece 24.

The workpiece support structure 100 further includes the second rotation member 150 which is rotatably mounted to the first rotation member 110. The second rotation member 150 includes a support plate 152 which is attached to the hub 120 of the first rotation member 110 by means of a bearing assembly 160. Preferably, the bearing assembly 160 is a ball or roller bearing assembly including a plurality of ball or roller bearings 162 disposed in a circular bearing cage 163 to provide for rotation of the second rotation member 150 with respect to the first rotation member 110.

Alternately, instead of a mechanical bearing assembly such as ball bearings or roller bearings, a non-contact gas bearing could be suitably employed as would be recognized by one of ordinary skill in the art.

The second rotation member 150 overlies and seals the opening 121 of the first rotation member 110. Vacuum is maintained between the first and second rotation members 110, 150 by means of a differentially pumped, circular, contact type vacuum seal system 180 similar to the vacuum seal system 130 described above. As can best be seen in FIG. 4, the vacuum seal system 180 includes two circular recesses or grooves 184 separated by circular channel 186 machined or formed in an upper surface 120b of the first rotation member hub 120. Disposed in each of the two grooves 184 is an O-ring and a plastic seal having a substantially square cross section. An upper surface of each of the two seals bears against a lower surface 152a of the second rotation member support plate 152.

The channel 186 is in fluid communication with a vacuum pump (not shown) via orifices (not shown) in the second rotation member support plate 152. The vacuum pump, which would be affixed to the hub 120, would be operated to draw a vacuum in the channel 186 thereby removing any air and/or contaminants that happen to leak from the outside atmospheric environment through the two seals formed by the outer and middle O-ring and plastic seal combinations. In addition to a differentially pumped circular vacuum seal system, other seal system designs such as a lip seal or other polymer material seal designs would also be suitable and are within the contemplated scope of the present invention. Non-contact vacuum seal systems known to those of ordinary skill in the art would also be suitable for the vacuum seal system 180.

The second rotation member 150 allows for a +/−180 degree rotation with respect to the first rotation member 110. The centerline or axis of rotation of the second rotation member 150 (labeled as AR2 in FIG. 2) is offset from the axis of rotation AR1 of the first rotation member 110 by 250 to 300 mm.

The drive mechanism 200 is mounted on the second rotation member 150. The drive mechanism 200 preferably is a motor or a hollow shaft servo actuator (shown schematically in FIGS. 4 & 5). The drive mechanism comprises a hollow shaft. An axis of rotation of the rotatable drive is aligned with the centerline or axis of rotation AR1 of the first rotation member 110. A suitable hollow shaft servo actuator is manufactured by HD Systems, Inc., 89 Cabot Court, Hauppauge, N.Y. 11788 (www.hdsystemsinc.com).

Attached to the drive mechanism 200 is a workpiece holder 204 that extends through first and second rotation members 110, 150 and into the implantation chamber interior region 22e. A portion 206 of the workpiece holder 204 inside the implantation chamber 22 is used to move the workpiece 24 for implantation of by the ribbon ion beam 14a. Vacuum is maintained between the workpiece holder 204 and second rotation member 150 by means of a vacuum seal system 210. The vacuum seal system 210 preferably a differentially pumped, contact type, circular vacuum seal system similar to the vacuum seal systems 130, 160 previously described. The vacuum seal system 210 comprises O-rings and plastic seals seated in a pair of circular recess 211 in a mounting support 201 (FIG. 4) of the drive mechanism 200. Disposed between the pair of recesses 211 is a channel 212 which is coupled by orifices to a vacuum pump. The vacuum pump draws a vacuum in the channel 212.

In addition to O-rings and plastic seals, other contact type seal system designs such as a lip seal or other polymer material seal designs, or a ferrofluidic seal would also be suitable for the vacuum seal system 210 and are within the contemplated scope of the present invention. Non-contact vacuum seal systems would also be suitable for the vacuum seal system 210.

The first and second rotation members 110, 150 and the drive mechanism 200 permit rotation of the workpiece holder 204 from anywhere between 0 to 360 degrees, thus, allowing the workpiece 24 to be set at any desired implantation angle (IA) for implantation. Once the desired implantation angle is obtained, reciprocating linear motion of the workpiece 24 for implantation of the implantation surface 25 is achieved by a coordinated and simultaneous rotation of the first and second rotation members 110, 150 and the rotatable drive 202. Proper rotation of these three elements 110, 150, 202 is controlled by the control electronics 26 creates a linear motion of the workpiece 24 inside the implantation chamber interior region 22e.

The reciprocating linear motion of the workpiece 24 is perpendicular to a normal vector of the workpiece implantation surface 25. The multiple independent degrees of freedom or motion of the workpiece support structure 100 allows for constant focal length scanning of the workpiece 24 in front of the ribbon ion beam 14a. In other words, the distance from the ribbon ion beam's entrance into the implantation chamber 22 to the line of impact of the ribbon ion beam 14a on the workpiece implantation surface 25 is always constant for any selected implantation angle. The implantation angle, that is, the angle between the axis of the reciprocating linear motion and the ion beam may vary anywhere between 0 and 89 degrees. This is achieved by rotation of the first rotation member 110. Thus, the workpiece support structure allows for a multitude of implantation or scan angles of the workpiece 24 in front of the ribbon ion beam 14a all at a constant focal length, that is, a constant distance d as shown in FIG. 1.

The workpiece 24 is held with respect to the workpiece holder 204 by means of the electrostatic clamp or chuck 102. The electrostatic clamp 102 is cooled in order to remove the energy or heat that is transferred from the workpiece 24 during implantation. In order to allow for quad or octal implants, preferably, the electrostatic clamp 102 is operatively coupled to a motor so that the workpiece support surface 104 of the clamp 102 can rotate within the work piece holder distal end 218 up to 360 degrees. The rotational centerline or axis of rotation of the electrostatic clamp 102, shown as the dashed line AR3 in FIG. 5, is aligned with a centerline of the workpiece 24. The electrostatic clamp 102 rotation is achieved by means of an electric motor (not shown) that is mounted within the workpiece holder distal end 218 and directly connected to the electrostatic clamp 102. Alternately, the motor may be coupled to the electrostatic clamp by a non-direct drive means such as a belt or cable (not shown).

The electrostatic chuck 102 is mounted within the workpiece holder distal end 218 by means of a bearing assembly 220. The bearing assembly 220 is preferably a ball or roller bearing assembly. Alternately, the bearing assembly 220 may be a non-contact gas bearing.

Vacuum between the electrostatic clamp 102 and workpiece holder distal end 218 is achieved by means of a face vacuum seal system 230. A seal system is necessary because the volume inside the workpiece holder 204 is at atmosphere. The vacuum seal system 230 is preferably a differentially pump, circular, contact type vacuum seal system like the seal systems 130, 180, 210 previously described. The vacuum seal system 230 comprises O-rings and plastic seals seated in two respective circular recesses 234 in an inner cylindrical surface of an end portion 236 of the workpiece holder end portion distal end 158 facing the electrostatic clamp 102. Disposed between the recesses is a channel 236 which is coupled by orifices to a vacuum pump. The vacuum pump draws a vacuum in the channel 236.

In addition to O-rings and plastic seals, other contact type seal system designs such as a lip seal or other polymer material seal designs, or a ferrofluidic seal would also be suitable for the vacuum seal system 230 and are within the contemplated scope of the present invention. Non-contact vacuum seal systems would also be suitable for the vacuum seal system 230.

While the present invention has been described with a degree of particularity, it is the intent that the invention include all modifications and alterations from the disclosed design falling with the spirit or scope of the appended claims.

I claim:

1. An ion beam implanter comprising:

a) an ion beam source for generating an ion beam moving along a beam line;

b) an implantation chamber defining an interior region wherein a workpiece is positioned to intersect the ion beam for ion implantation of an implantation surface of the workpiece by the ion beam; and c) workpiece support structure coupled to the implantation chamber and supporting the workpiece, the workpiece support structure including:

1) a first rotation member rotatably coupled to the implantation chamber and including an opening extending through the rotation member and aligned with an opening in a wall of the implantation chamber;

2) a second rotation member rotatably coupled to the first rotation member and having an axis of rotation offset from an axis of rotation of the first rotation member, the second rotation member overlying the opening of the first rotation member;

3) a third member fixedly attached to the second rotation member, the third member including a rotatable drive supporting the workpiece, the rotatable drive being rotatable with respect the first and second rotation members, extending through the second rotation member and the opening of the first rotation member, the first rotation member, the second rotation member and the rotatable drive of the third rotation member rotating to move the workpiece along a path of travel for implantation of the implantation surface wherein a distance that the ion beam moves through the implantation chamber before striking the implantation surface of the workpiece is constant.

2. The ion beam implanter of claim 1 wherein an axis of rotation of the rotatable drive of the third member is aligned with the axis of rotation of the first rotation member.

3. The ion beam implanter of claim 1 wherein the axis of rotation of the first rotation member is aligned with the workpiece implantation surface.

4. The ion beam implanter of claim 1 wherein the axis of rotation of the second rotation member is offset from the axis of rotation of the first rotation member by a distance of 250 to 300 mm.

5. The ion beam implanter of claim 1 wherein the axes of rotation of the first and second rotation members are perpendicular to a direction of the portion of the ion beam within the implantation chamber.

6. The ion beam implanter of claim 1 wherein the path of travel of the workpiece is a linear path of travel.

7. The ion beam implanter of claim 1 wherein the workpiece support structure further includes a workpiece support affixed to the rotatable drive of the third member extending inside the implantation chamber.

8. The ion beam implanter of claim 7 wherein the workpiece support structure further includes an electrostatic clamp for holding the workpiece during implantation, the electrostatic clamp being affixed to the workpiece support.

9. The ion beam implanter of claim 8 wherein the electrostatic clamp is rotatable with respect to the ion beam.

10. The ion beam implanter of claim 1 wherein the first rotation member is coupled to the implantation station by a bearing assembly.

11. The ion beam implanter of claim 1 wherein the second rotation member is coupled to the first rotation member by a bearing assembly.

12. The ion beam implanter of claim 1 wherein a vacuum is maintained between the implantation chamber and the first rotation member by a circular vacuum seal.

13. The ion beam implanter of claim 1 wherein a vacuum is maintained between the first rotation member and the second rotation member by a circular vacuum seal.

14. The ion beam implanter of claim 7 wherein vacuum is maintained between the work support and the second rotation member by a vacuum seal.

15. The ion beam implanter of claim 14 wherein a vacuum is maintained between the implantation chamber and the first rotation member by a circular vacuum seal.

16. The ion beam implanter of claim 14 wherein a vacuum is maintained between the first rotation member and the second rotation member by a circular vacuum seal.

17. An ion beam implanter comprising:
   a) an ion beam source for generating an ion beam moving along a beam line;
   b) an implantation chamber wherein a workpiece is positioned to intersect the ion beam for ion implantation of a surface of the workpiece by the ion beam; and
   c) workpiece support structure coupled to the implantation chamber and supporting the workpiece, the workpiece support structure including:
      1) a first rotation member rotatably coupled to the implantation chamber and having an opening through the member, the opening being aligned with an opening in a wall of the implantation chamber; and
      2) a second rotation member rotatably coupled to the first rotation member and overlying the opening of the first rotation member; and
      3) a drive mechanism fixedly coupled to the second rotation member and including a rotatable drive extending through the second rotation member and the opening of the first rotation member and supporting the workpiece within an interior region of the implantation chamber, the first and second rotation members and the rotatable drive of the drive mechanism rotation such that the workpiece implantation surface is implanted at a desired implantation angle and the workpiece moves along a path of travel coincident with the desired implantation angle and such that a focal length of the ion beam is constant.

18. The ion beam implanter of claim 17 wherein an axis of rotation of the rotatable drive of the drive mechanism is aligned with the axis of rotation of the first rotation member.

19. The ion beam implanter of claim 17 wherein the axis of rotation of the first rotation member is aligned with the workpiece implantation surface.

20. The ion beam implanter of claim 17 wherein the axis of rotation of the second rotation member is offset from the axis of rotation of the first rotation member by a distance of 250 to 300 mm.

21. The ion beam implanter of claim 17 wherein the axes of rotation of the first and second rotation members are perpendicular to a direction of the portion of the ion beam within the implantation chamber.

22. The ion beam implanter of claim 17 wherein the path of travel of the workpiece is a linear path of travel.

23. The ion beam implanter of claim 22 wherein vacuum is maintained between the work support and the second rotation member by a vacuum seal.

24. The ion beam implanter of claim 17 wherein the workpiece support structure further includes a workpiece support affixed to the rotatable drive of the drive mechanism extending inside the implantation chamber.

25. The ion beam implanter of claim 24 wherein the workpiece support structure further includes an electrostatic clamp for holding the workpiece during implantation, the electrostatic clamp being affixed to the workpiece support.

26. The ion beam implanter of claim 25 wherein the electrostatic clamp is rotatable with respect to the ion beam.

27. The ion beam implanter of claim 17 wherein the first rotation member is coupled to the implantation station by a bearing assembly.

28. The ion beam implanter of claim 17 wherein the second rotation member is coupled to the first rotation member by a bearing assembly.

* * * * *